(12) United States Patent
Derrick

(10) Patent No.: US 6,518,852 B1
(45) Date of Patent: Feb. 11, 2003

(54) INFORMATION SIGNAL COMPRESSOR AND EXPANDER

(76) Inventor: Raymond J. Derrick, 30 Williams Road, North Rocks, NSW, 2154 (AU)

( * ) Notice: Subject to any disclaimer, the term of this patent is extended or adjusted under 35 U.S.C. 154(b) by 0 days.

(21) Appl. No.: 09/551,289

(22) Filed: Apr. 18, 2000

Related U.S. Application Data

(60) Provisional application No. 60/130,017, filed on Apr. 19, 1999.

(51) Int. Cl.[7] .............................. H03G 7/00; H04B 1/64
(52) U.S. Cl. ........................ 333/14; 333/17.2; 381/106; 455/72
(58) Field of Search ........................ 333/14, 17.2, 132, 333/134, 126, 129; 381/106; 455/72

(56) References Cited

U.S. PATENT DOCUMENTS

| | | | | |
|---|---|---|---|---|
| 2,771,518 A | * | 11/1956 | Sziklai | ........................ 333/132 |
| 3,846,719 A | | 11/1974 | Dolby | .......................... 333/14 |
| RE28,426 E | | 5/1975 | Dolby | .......................... 333/14 |
| 3,903,485 A | | 9/1975 | Dolby | .......................... 333/14 |
| 4,137,510 A | * | 1/1979 | Iwahara | ...................... 333/132 |
| RE30,468 E | * | 12/1980 | Dolby et al. | .............. 333/14 X |
| 4,363,007 A | | 12/1982 | Haramoto et al. | ............ 333/14 |
| 4,484,345 A | * | 11/1984 | Stearns | .................... 333/132 X |
| 4,490,691 A | | 12/1984 | Dolby | .......................... 333/14 |
| 4,498,055 A | * | 2/1985 | Dolby | ....................... 333/14 X |
| 4,547,741 A | * | 10/1985 | Katakura | .................. 333/14 X |
| 4,701,722 A | * | 10/1987 | Dolby | .......................... 333/14 |
| 4,736,433 A | | 4/1988 | Dolby | ........................ 381/106 |
| 4,801,890 A | * | 1/1989 | Dolby | ....................... 333/14 X |

* cited by examiner

Primary Examiner—Robert Pascal
Assistant Examiner—Barbara Summons
(74) Attorney, Agent, or Firm—Frank J. Catalano

(57) ABSTRACT

An apparatus and method for compressing and expanding an information signal for use in noise reduction which includes an input terminal to receive the information signal, a first frequency crossover circuit coupled to the input terminal and configured to divide the information signal into a first and second frequency band. A second frequency crossover circuit coupled with the first crossover circuit configured to receive at least a portion of the information signal within the first frequency band and to further divide the information signal into a third and fourth frequency band. A third frequency crossover circuit coupled with the first crossover circuit configured to receive at least a portion of the information signal within the second frequency band and to divide the information signal into a fifth and sixth frequency band.

31 Claims, 14 Drawing Sheets

INFORMATION SIGNAL COMPRESSOR AND EXPANDER

REFERENCE TO RELATED APPLICATIONS

This application claims priority to U.S. Prov. No. 60/130,017, filed Apr. 19, 1999.

FIELD

The present invention relates to the noise reduction of information signals. In particular, the invention relates to an apparatus and method for providing compression and expansion of information signals prior to and following transmission or recording.

BACKGROUND

Many methods for compressing and expanding of information signals including audio and video signals have been proposed and implemented since the late 1960s. These methods are to effect an increase in dynamic range and, hence, a reduction of noise for signals which are transmitted or recorded using a medium that has a limited dynamic range.

U.S. Pat. Nos. 3,846,719 and 3,903,485 disclose a process which forms the basis of a commercial system known as A-type noise reduction which divides the frequency spectrum into 4 bands with crossover points at 80 Hz, 3 kHz, and 9 kHz. The process provides a maximum noise reduction of about 10 dB for the three lower bands and about 15 dB for the uppermost band. In the presence of a dominant signal this process functions best with a frequency that falls in the middle region of one of the bands. In such a case this will cause the band to compress whilst the other three bands are largely unaffected. Thus the noise reduction action is maintained over a large portion of the spectrum. One drawback of this system is that if a dominant signal has a frequency in the region of one of the crossover points, then both of the bands which are separated by that crossover frequency are compressed and hence there is a loss of noise reduction over two entire bands. This is particularly a problem in the mid frequency region where the bandwidth of the mid band (Band 2) is very broad, being from 80 Hz to 3 kHz. Thus, a dominant signal with a frequency in the region of 3 kHz results in compression of the mid upper bands (Bands 2 and 3) which collectively cover from 80 Hz to 9 kHz, (i.e. the majority of the audio frequency spectrum) so the loss of noise reduction action is very considerable.

U.S. Pat. No. Re 28,426 discloses a process which forms the basis of a commercial system known as B-Type noise reduction which uses a variable filter in combination with a fixed high pass filter to achieve a degree of noise reduction in the high frequency part of the spectrum. This system solves some of the problems of the Dolby A-type system but introduces new problems in that a dominant high frequency signal component will cause the sliding filter to slide upwards to a point above the frequency of the dominant component. This results in a substantial loss of noise reduction below the frequency of the dominant component.

U.S. Pat. No. 4,490,691, discloses a process which forms the basis of a commercial system known as C-type noise reduction and part of the basis of a later system known commercially as Spectral Recording. The C-type process was devised to improve the performance of the B-type system by the use of multiple sliding band filters in series and various frequency pre-emphasis and de-emphasis techniques. However, like the B-Type noise reduction system, this process still suffers from a significant loss of noise reduction in the frequency region below a high frequency high level dominant signal component.

U.S. Pat. No. 4,736,433 discloses a process which along with U.S. Pat. No. 4,490,691, forms part of the basis of a commercial system known as Spectral Recording which was devised to address the combined limitations of the A-type, B-type and C-type systems using a process called "action substitution" which combines fixed and sliding band compressors. The Spectral Recording process divides the audio spectrum into just two bands with a crossover at 800 Hz with a maximum noise reduction of about 16 dB for the low frequency band and about 24 dB for the high frequency band. The process employs a fixed band compressor and a sliding band compressor in each of the upper and lower frequency bands. The fixed band compressor covers the full bandwidth of the frequency band and the sliding band compressor slides upward in the case of the high frequency band and downward in the case of the low frequency band with increasing signal level. This system maintains a high level of noise reduction in the upper and lower portions of the audio spectrum particularly in the presence of dominant signals with frequencies in the middle region of the audio spectrum because the sliding filters slide outwards from the middle of the spectrum, thus overcoming the main drawback of the A-type system. However, if a dominant signal has a frequency at the upper or lower ends of the spectrum there is still a potential for a significant loss of noise reduction in the upper middle region in the case of a high frequency dominant signal or in the lower middle region in the case of a low frequency dominant signal.

The present invention overcomes the above mentioned drawbacks of all prior art noise reduction processes by creating the divisions between the frequency bands by the use of variable crossover circuits, the variable crossover frequencies being controlled by the spectral and level content of the input signals.

SUMMARY

An apparatus and method for compressing and expanding an information signal for use in noise reduction which includes an input terminal to receive the information signal, a first frequency crossover circuit coupled to the input terminal and configured to divide the information signal into a first and second frequency band. A second frequency crossover circuit coupled with the first crossover circuit configured to receive at least a portion of the information signal within the first frequency band and to further divide the information signal into a third and fourth frequency band. A third frequency crossover circuit coupled with the first crossover circuit configured to receive at least a portion of the information signal within the second frequency band and to divide the information signal into a fifth and sixth frequency band.

In one embodiment the frequency crossover circuits are variable frequency crossover circuits such that the frequency bands are separated by a variable crossover frequency and each frequency crossover circuit includes feedback control.

In one embodiment each frequency crossover circuit includes feedback control which includes weighting circuits to provide greater sensitivity to frequency of the information signal.

In one embodiment, the second and third frequency crossover circuits include a one compressor circuit for each frequency band and configured to compress the band when a dominant signal is present in the information signal which falls within a predefined frequency range.

One advantage of the invention is that it provides a compressor and expander implemented through a relatively simple circuit design.

Another advantage is that the invention is highly adaptive to constantly varying real world signals.

Another advantage is that the invention limits the amount of compression of the information signal by providing a plurality of bands separated by a plurality of variable crossover frequencies.

Another advantage is the invention minimizes mid frequency modulation effects by limiting the shifting of the variable crossover frequencies.

Yet another advantage is that the invention limits the bandwidth which is compressed when a dominant signal is present.

Another advantage is that the invention limits the compression of frequency bands which do not include a dominant signal, by shifting the crossover frequencies.

BRIEF DESCRIPTION OF THE DRAWINGS

Additional advantages of the invention will become apparent upon reading the following detailed description and upon reference to the drawings, in which.

DETAILED DESCRIPTION

Exemplary embodiments are described with reference to specific configurations. Those skilled in the art will appreciate that various changes and modifications can be made while remaining within the scope of the claims.

The present invention provides for a method and apparatus for the compression, expansion and noise reduction of information signals. The invention is suitable for the compression, expansion and noise reduction of information signals including audio signals, visual signals and other electrical signals. For simplicity, the following embodiments described below are described in relation to the compression and expansion of an audio signal. However, the present invention is equally applicable to other information signals including video signals and such, and is not to be construed as limiting the invention.

Figure 1A:
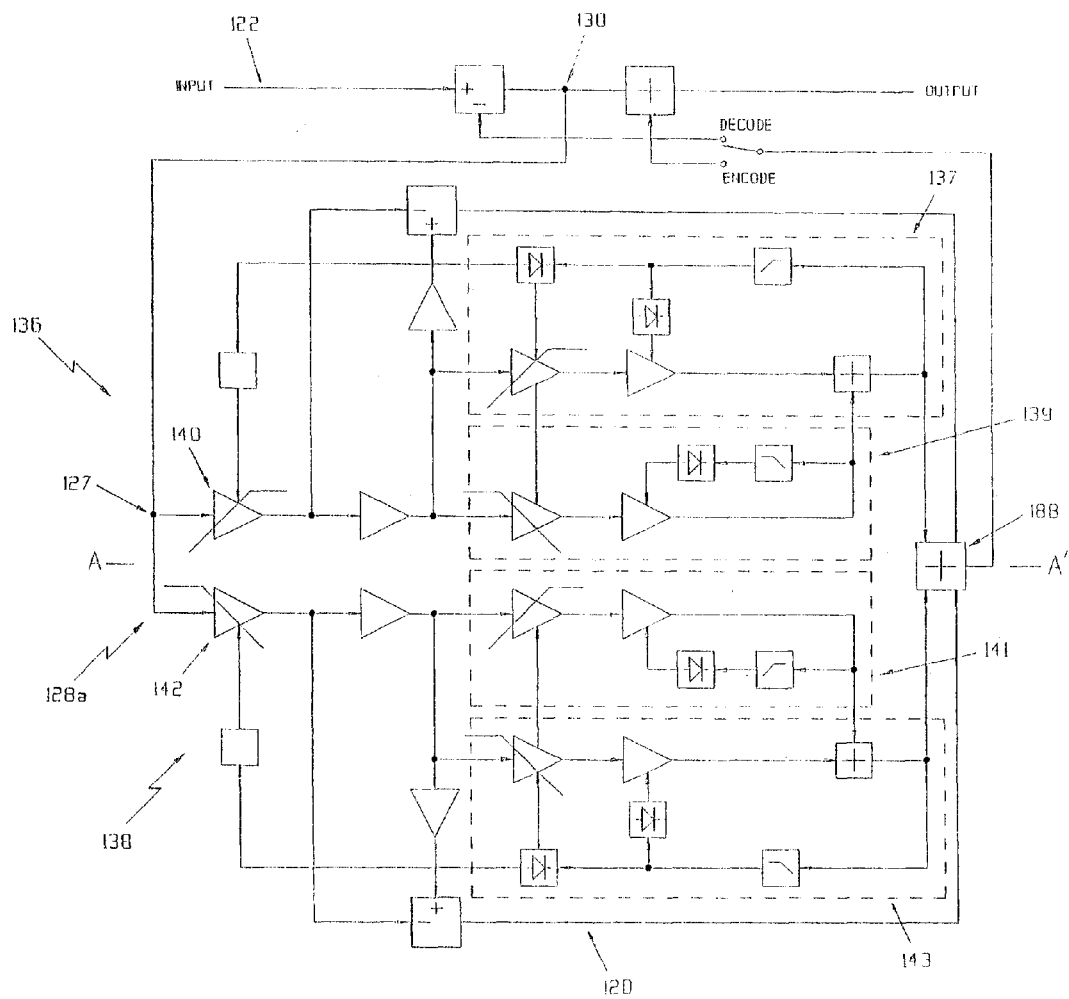
FIG. 1A depicts a schematic diagram of one embodiment of the compressor expander with three variable frequency crossover circuits.
Figure 1B:
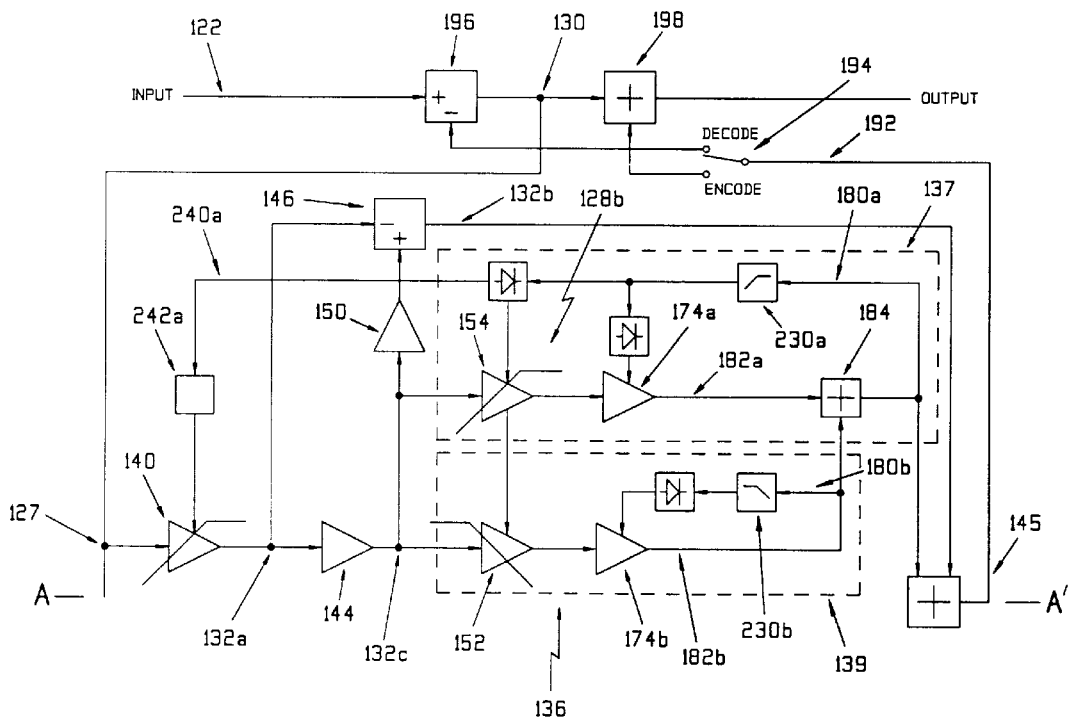
FIG. 1B depicts the high frequency subcircuit of FIG. 1A.
Figure 1C:
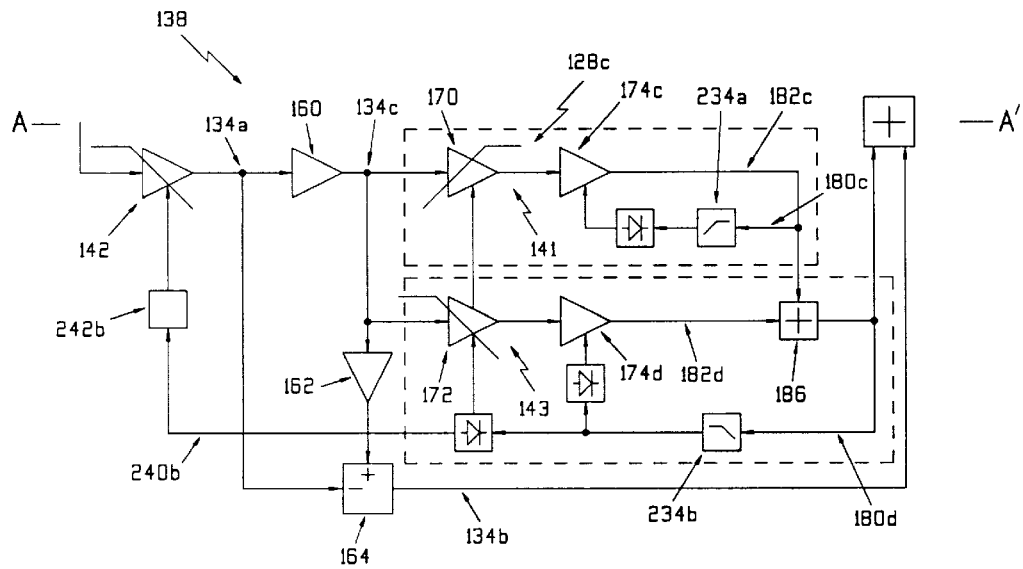
FIG. 1C depicts the low frequency subcircuit of FIG. 1A.
Figure 2A:
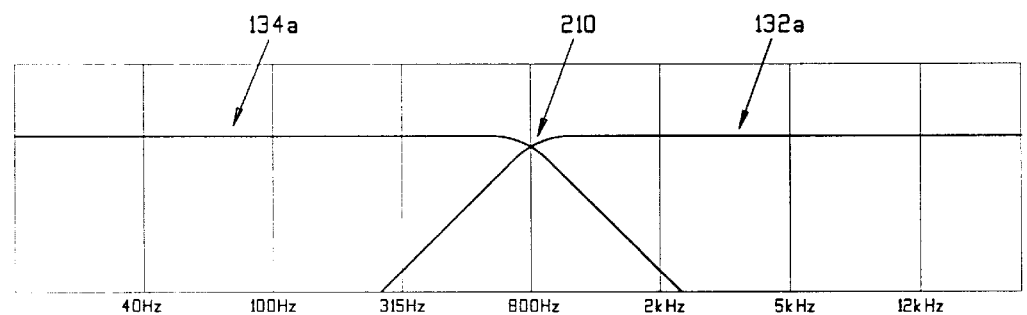
FIGS. 2A–D show a logarithmic graphical representation of a first frequency band and a second frequency band of an audio information signal as divided by the invention.

FIG. 1 shows a schematic diagram of one embodiment of the novel signal compressor and expander 120 which provides compression or expansion of an information signal. The information signal is taken from main path 122 at node 130 and coupled to an input terminal 127. In one embodiment the compressor expander 120 is configured in two subcircuits, a high pass or high frequency subcircuit 136 and a low pass or low frequency subcircuit 138. In the embodiment depicted in FIG. 1, the high and low frequency subcircuits 136 and 138 are divided at the line designated A–A'. The high frequency subcircuit 136 is further divided into two subcircuits including an upper mid-high frequency (MHF) subcircuit 137 and a lower MHF subcircuit 139. The low frequency subcircuit 138 is also further divided into an upper mid-low frequency (MLF) subcircuit 141 and a lower MLF subcircuit 143. The high pass subcircuit 136 and low pass subcircuit 138 are initially formed through first single pole variable frequency crossover circuit 128a. First variable frequency crossover circuit 128a divides the information signal into a first high pass or frequency band 132a and a first low pass or frequency band 134a, each with similar cutoff frequencies. FIG. 2A shows a logarithmic frequency scale with the first high pass band 132a, the first low pass band 134a and a variable crossover frequency 210 at about 800 Hz. First single pole variable frequency crossover circuit 128a includes a first variable high pass filter (VHPF) 140 and a first variable low pass filter (VLPF) 142 both with a quiescent or cutoff frequency of approximately 800 Hz. This provides the crossover frequency 210 at 800 Hz. The crossover frequency 210 is selected to provide an approximate midpoint in the audio logarithmic frequency spectrum, however, the crossover frequency can be selected at any level for any frequency spectrum without departing from the inventive aspects of the invention. First VHPF 140 and first VLPF 142 are inter-connected such that the cutoff frequencies of the two filters track each other up and down the frequency spectrum and are thus maintained at approximately an equal value.

Figure 2B:
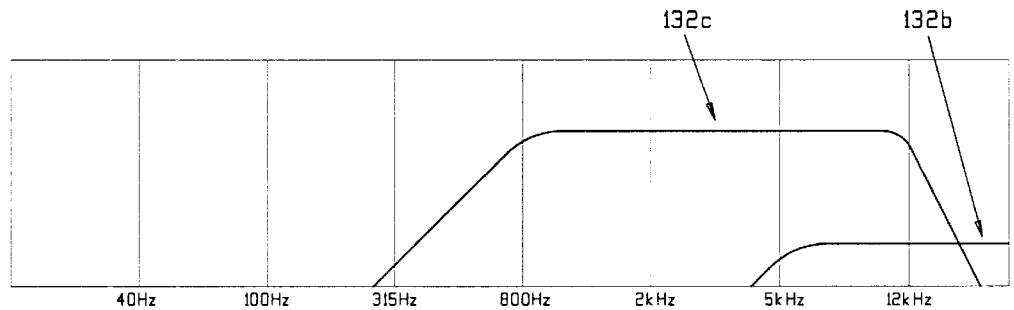

Referring to FIG. 2B, the portion of the information signal within the first high frequency band 132a is then divided into two further bands, an upper most high frequency band 132b and a mid-high frequency (MHF) band 132c. First high frequency band 132a is initially divided through a fixed frequency crossover including a first fixed low pass filter (FLPF) 144 configured to pass at least a portion of the information signal within mid-high frequency band 132c. First FLPF 144 is coupled to a second FLPF 150 which couples to a first summing circuit 146. First VHPF 140 is further coupled to the first summing circuit 146. The first summing circuit 146 sums first high frequency band 132a and mid-high frequency band 132c to pass the portion of the information signal within upper most high frequency band 132b. In one embodiment, first high frequency band 132a is inverted by first summing circuit 146 and then added with mid-high frequency band 132c. In effect, the mid-high frequency band 132c is subtracted from the inversed first high frequency band 132a to pass the upper most high frequency band 132b. The upper most high frequency band 132b is configured in one embodiment to have a lower limit or cutoff frequency of about 5 kHz, produced by the first summing circuit 146 and both the first and second FLPF 144 and 150, with a rolloff of approximately 6 dB/octave. The mid-high frequency band 132c has a lower limit established by the 800 Hz crossover frequency of the first VHPF 140 with a rolloff of about 6 dB/octave. The mid-high frequency band 132c has an upper cutoff frequency of about 12 kHz produced by the first FLPF 144 with a rolloff of about 12 dB/octave, which provides a crossover frequency 214 between the upper most frequency band 132b and the mid-high frequency band 132c. This arrangement provides a significant overlap of the upper most frequency band 132b into the mid-high frequency band 132c region, as shown in FIG. 2B, thus establishing greater spectrum coverage.

Figure 2C:
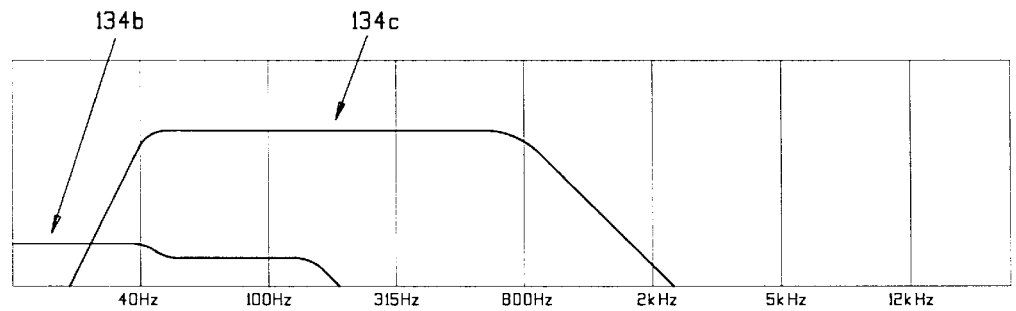

Referring to FIGS. 1 and 2C, the portion of the information signal within first lower frequency band 134a is also divided into two further bands, lower most low frequency band 134b and mid-low frequency band 134c. First low frequency band 134a is initially divided through a fixed frequency crossover including a first fixed high pass filter (FHPF) 160 to pass mid-low frequency band 134c. First FHPF 160 is coupled to a second FHPF 162 which couples to a second summing circuit 164. First VLPF 142 is further coupled to second summing circuit 164 such that the first low frequency band 134a and mid-low frequency band 134c are summed resulting in the lower most low frequency band 134b. In one embodiment, summing circuit 164 adds the inversed first low frequency band 134a with the mid-low frequency band 134c. The lower most low frequency band 134b is configured in one embodiment to have an upper limit or cutoff frequency of about 63 Hz, produced by the second summing circuit 164 and both the first and second FHPF 160 and 162, with a rolloff of approximately 6 dB/octave. In one embodiment, second FHPF 162 is a shelving network filter which provides approximately 2 dB of attenuation between about 40 Hz and 200 Hz with about 6 dB/octave attenuation above 200 Hz which provides the effect of extending the overlap of the lower most low frequency band 134b response well into the mid-low frequency band 134c. The mid-low frequency band 134c has an upper limit or cutoff frequency established by the 800 Hz crossover frequency of the first VLPF 142 with a rolloff of about 6 dB/octave and a lower cutoff frequency of about 40 Hz produced by the first FHPF 160 with a rolloff of about 12 dB/octave, which provides a crossover frequency between the lower most frequency band 134b and the mid-low frequency band 134c. This arrangement provides a significant overlap of the lower most frequency band 134b into the mid-low frequency band 134c region as shown in FIG. 2C.

Figure 2D:
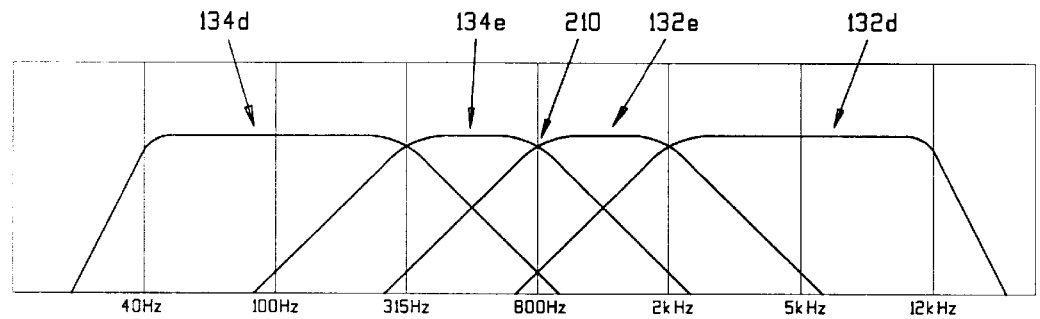

Referring to FIGS. 1 and 2D, the portion of the information signal within mid-high frequency band 132c is then further divided through upper and lower mid-high frequency subcircuits 137 and 139 into two further bands, an upper mid-high frequency (MHF) band 132d and a lower MHF band 132e. In one embodiment, lower mid-high frequency subcircuit 139 includes a second VLPF 152 and the upper mid-high frequency subcircuit 137 includes a second VHPF 154. Second VLPF 152 and second VHPF 154 are interconnected to form a second single pole variable frequency crossover circuit 128b. Both the second VLPF 152 and second VHPF 154 couple to the first FLPF 144 to receive the portion of the information signal within mid-high frequency band 132c. Second VLPF 152 and second VHPF 154 are inter-connected such that the cutoff frequencies of the two filters track each other up and down the frequency spectrum and are thus approximately equal at substantially all times. Second VLPF 152 provides an upper frequency cutoff at approximately 2 kHz while first VHPF 140 provides the lower cutoff at approximately 800 Hz, thus generating the lower MHF band 132e. Second VHPF 154 provides a lower frequency cutoff also at approximately 2 kHz while first FLPF 144 provides the upper cutoff at about 12 kHz, thus generating the upper MHF band 132d. A variable crossover frequency 212 is thus defined between the two MHF bands 132d and 132e at approximately 2 kHz.

Still referring to FIGS. 1 and 2D, the portion of the information signal within mid-low frequency band 134c is also further divided through upper and lower mid-low frequency subcircuits 141 and 143 into two further bands, a lower mid-low frequency (MLF) band 134d and an upper MLF band 134e. In one embodiment, lower mid-low frequency subcircuit 143 includes a third VHPF 172 and the upper mid-low frequency subcircuit 141 includes a third VLPF 170. Third VHPF 172 and third VLPF 170 are interconnected to form a third single pole variable frequency crossover circuit 128c. Both the third VHPF 172 and third VLPF 170 couple to the first FHPF 160 to receive the portion of the information signal within mid-low frequency band 134c. Third VHPF 172 and third VLPF 170 are inter-connected such that the cutoff frequencies of the two filters track each other up and down the frequency spectrum and are thus approximately equal at substantially all times. Third VHPF 172 provides a lower frequency cutoff at approximately 315 Hz while first VLPF 142 provides the upper cutoff at about 800 Hz, thus generating the upper MLF band 134e. Third VLPF 170 provides an upper frequency cutoff also at approximately 315 Hz while first FHPF 160 provides the lower cutoff at approximately 40 Hz, thus generating the lower MLF band 134d. A variable crossover frequency is thus defined between the two mid-low frequency bands at approximately 315 Hz.

Figure 3:
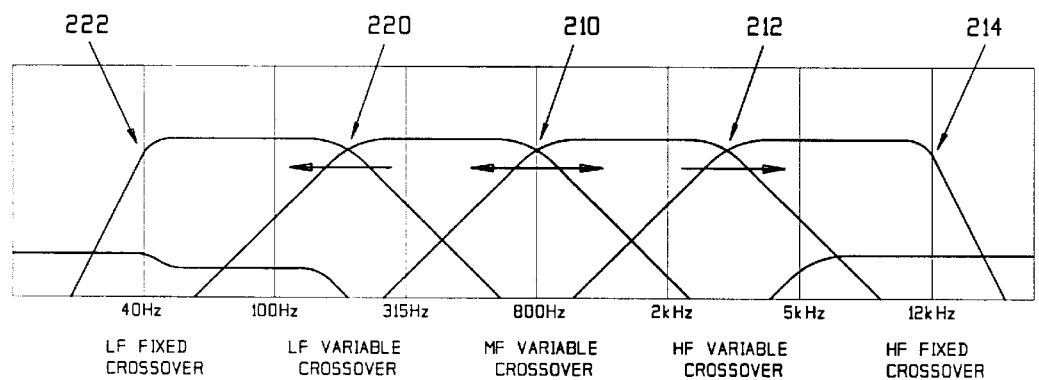
FIG. 3 shows a logarithmic graphical representation of six different frequency bands of an audio information signal as divided in one embodiment of the invention as divided by the invention.

FIG. 3 depicts all six of the frequency bands showing a frequency distribution of the crossover conditions for one embodiment of the invention used in the compression and expansion of an audio information signal. Initial or mid-frequency variable crossover 210 is shown at about 800 Hz. The mid-high variable frequency crossover 212 is shown at about 2 kHz. The upper high fixed frequency crossover 214 is shown at about 12 kHz. The mid-low variable frequency crossover 220 is shown at about 315 Hz. The low fixed crossover frequency 222 is shown at about 40 Hz.

Referring back to FIG. 1, the four mid frequency bands of the six resulting frequency bands, lower MLF 134d, upper MLF 134e, lower MHF 132e and upper MHF 134d bands, are then each passed to compressor circuits 174a–d. Second VHPF 154 couples to first compressor circuit 174a, second VLPF 152 coupled to second compressor circuit 174b, third VHPF 170 couples to third compressor circuit 174c, and third VLPF 172 couples to fourth compressor circuit 174d. Each compressor circuit is coupled to an individual control path 180a–d to provide feedback control to the variable filters 140, 142, 152, 154, 170 and 172, and compressor circuits 174*a–d*. First compressor circuit output 182*a* is summed with second compressor circuit output 182*b* in the third summing circuit 184, and third compressor circuit output 182*c* is summed with the fourth compressor circuit output 182*d* in the fourth summing circuit 186. The summation results of third and fourth summing circuits 184 and 186 are summed together along with the upper most frequency band 132*b* and the lower most frequency band 134*b* in a final summing circuit 188 to produce the compressed or expanded output 192 of the secondary path 126 on output terminal 145.

Compressor expander 120 includes switch 194 which allows compressor expander 120 to be switched between a compressor and an expander. When switch 194 is in a first position, as shown in FIG. 1, switch 194 directs compressor and expander output 192 to a fifth summing circuit 196 which sums the inverse compressor expander output 192 from the signal on main line 122. When switch 194 is in a second position, compressor expander output 192 is coupled to a sixth summing circuit 198 which sums the compressor expander output with the signal on the main line 122.

Figure 4:
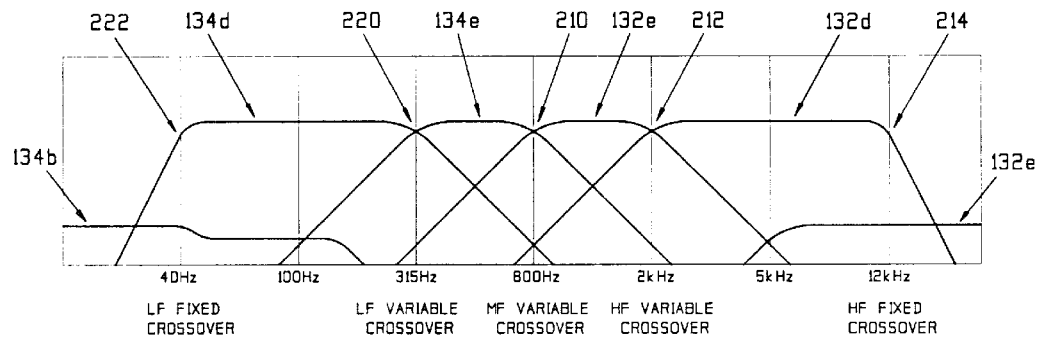
FIG. 4 shows a logarithmic graphical representation of six frequency bands of an audio information signal at quiescent conditions as divided by the invention.

In one embodiment, each of the four mid frequency bands 132*d*, 132*e*, 134*d*, and 134*e* have approximately the same quiescent gain of about 15 to 25 dB. However, the quiescent gains can differ between the mid frequency bands without departing from the inventive features of the invention. FIG. 4 shows the quiescent conditions for audio signal crossover frequencies. The quiescent mid-high crossover frequency 212, between the lower MHF band 132*e* and the upper MHF band 132*d*, is approximately 2 kHz. The quiescent mid-low crossover frequency 220, between lower MLF band 134*d* and upper MLF band 134*e*, is approximately 315 Hz. The upper most frequency band 132*b* and the lower most frequency band 134*b* are uncompressed and each has a gain of approximately unity.

Referring back to FIG. 1, in one embodiment, both of the high frequency crossover control paths 180*a* and 180*b* are frequency weighted by high frequency weighting circuits 230*a* and 230*b* to increase the sensitivity of control paths 180*a* and 180*b* to higher frequencies considerably beyond that afforded by the initial 800 Hz mid-frequency crossover 210. As the level of high frequency signals increases, the mid-high variable crossover frequency 212 shifts or moves upwards in frequency to broaden the bandwidth of the lower MHF band 132*e* with a corresponding reduction in the bandwidth of upper MHF band 132*d*. The mid-high variable crossover frequency 212 continues to move upwards until a high frequency limit is reached beyond which no further movement is permitted. The frequency limit is determined by the high frequency weighting circuits 230*a–b*. In one embodiment the high frequency limit is approximately 10 kHz.

In one embodiment, both of the low frequency crossover control paths 180*c* and 180*d* are frequency weighted by low frequency weighting circuits 234*a* and 234*b* to increase the sensitivity of control paths 180*c* and 180*d* to lower frequencies considerably beyond that afforded by the initial 800 Hz mid-frequency crossover 210. As the level of low frequency signals increases, the mid-low variable crossover frequency 220 moves downwards in frequency to broaden the bandwidth of upper MLF band 134*e* with a corresponding reduction in the bandwidth of lower MLF band 134*d*. Mid-low variable crossover frequency 220 continues to move downwards until a low frequency limit is reached beyond which no further movement is permitted. The low frequency limit is determined by the low frequency weighting circuits 234*a–b*. In one embodiment the low frequency limit is set to about 80 Hz.

The mid-frequency variable crossover 210, created by first VHPF 140 and first VLPF 142, is further controlled by an increasing threshold control loop 240*a* and a decreasing threshold control loop 240*b*. Increasing threshold control loop 240*a* includes threshold circuit 242*a*, and decreasing threshold control loop 240*b* includes threshold circuit 242*b*. Increasing threshold control loop 240*a* causes the mid-frequency variable crossover 210 to shift up in frequency and the decreasing threshold control loop 240*b* causes the mid-frequency variable crossover 210 to shift down in frequency. Increasing control loop 240*a* receives the control signal from the high frequency crossover control path 180*a* while the decreasing threshold control loop 240*b* receives the control signal from the low frequency crossover control path 180*d*. Thus, the increasing and decreasing control loops 240*a–b* are dependent on the mid-high variable crossover frequency 212 and mid-low variable crossover frequency 220, respectively. As such, high frequency threshold control circuit 242*a* is activated when mid-high variable crossover frequency 212 increases above a predefined threshold frequency and low frequency threshold control circuit 242*b* is activated when mid-low variable crossover frequency 220 falls below a predefined threshold frequency. In one embodiment, if mid-high frequency variable crossover 212 moves upward in frequency beyond about 3 kHz, mid-frequency crossover 210 will begin to move upwards at about the same rate thus maintaining a maximum bandwidth for lower MHF band 132*e* of about 3.2 kHz.

Likewise, if the mid-low frequency variable crossover 220 moves downward in frequency beyond about 250 Hz, the mid-frequency crossover 210 begins to move downwards at about the same rate thus maintaining a maximum bandwidth for the upper MLF band 134*e* of about 550 Hz. If both mid-high and mid-low variable crossovers 212 and 220 concurrently shift outward at approximately the same rate, the mid-frequency crossover 210 shifts in accordance with the difference between the two threshold control loops 240*a* and 240*b*. Thus, if both mid-high and mid-low frequency variable crossovers 212 and 220 shift at the same degree or rate, there will be no movement of the mid-frequency crossover 210.

Figure 5A:
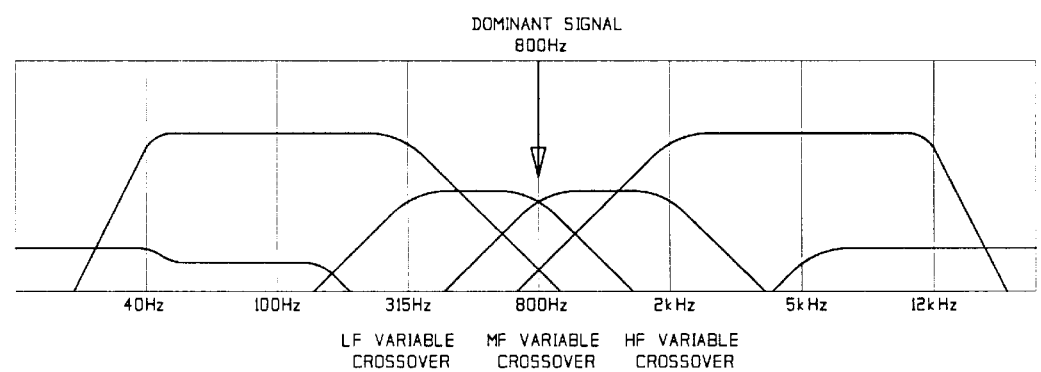
FIGS. 5A–F show a logarithmic graphical representation of six frequency bands of an audio information signal with a dominant signal at various points along the upper audio frequency spectrum as divided by the invention.
Figure 5B:
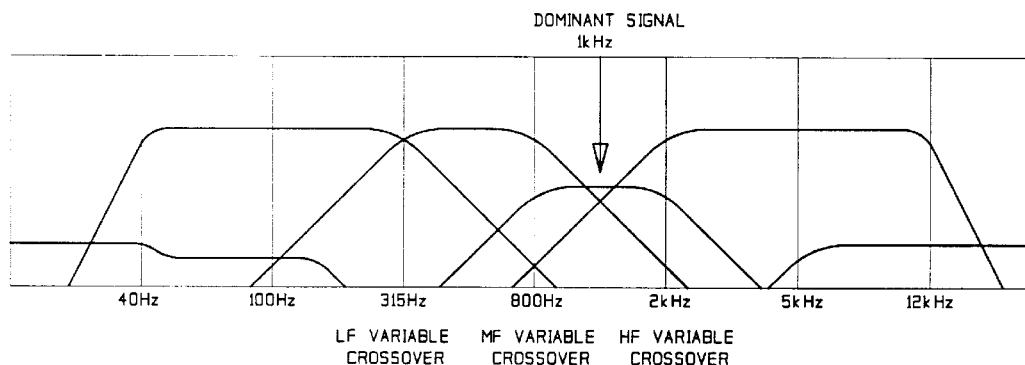
Figure 5C:
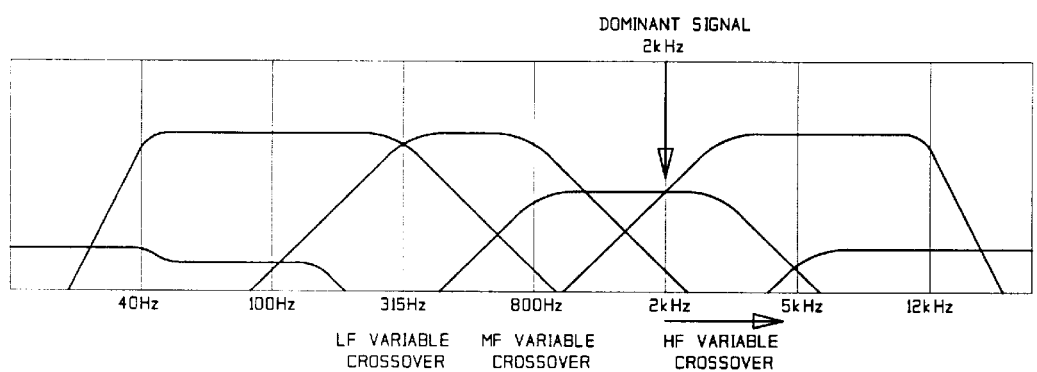
Figure 5D:
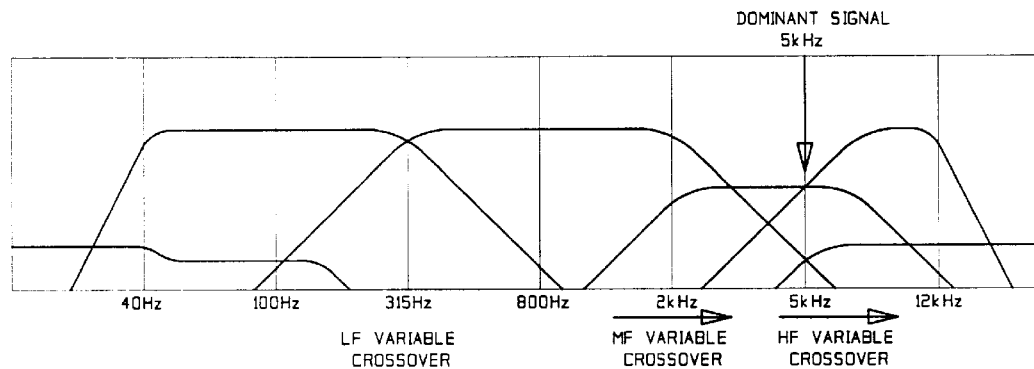

Because the three middle crossover frequencies are formed as variable crossovers, the invention allows the crossover frequencies to be shifted based on the frequency of dominant signals. Because the crossover frequencies shift, the invention prevents overly broad compression of non-dominant signal components. As can be seen in FIGS. 5A–D, as a dominant signal increases in frequency, the mid-high variable crossover 212, mid variable crossover 210 and mid-low variable crossover 220 shift up in frequency. FIG. 5A shows a dominant signal at 800 Hz, with approximately equal compression and distribution taking place between lower MHF band 132*e* and upper MLF band 134*e*. As the dominant signal shifts to a higher frequency, as shown in FIG. 5B, the upper MLF band 134*e* becomes less effected by dominant signal while the lower MHF band 132*e* is compressed. Due to crossover control paths 180*a–b*, as the dominant signal continues to increase in frequency, the mid-high frequency crossover 212 shifts to a higher frequency as shown in FIG. 5C. FIG. 5D shows the shift of both the mid variable crossover 210 and the mid-high variable crossover 212 as the dominant signal exceeds threshold limits of about 3 kHz activating threshold circuit 242*a* while still limiting the compression to the lower MHF band 132*e*.

Figure 5E:
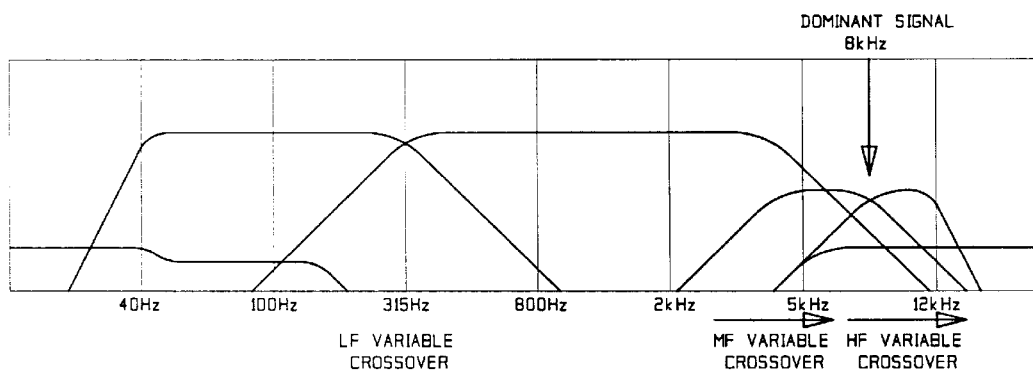
Figure 5F:
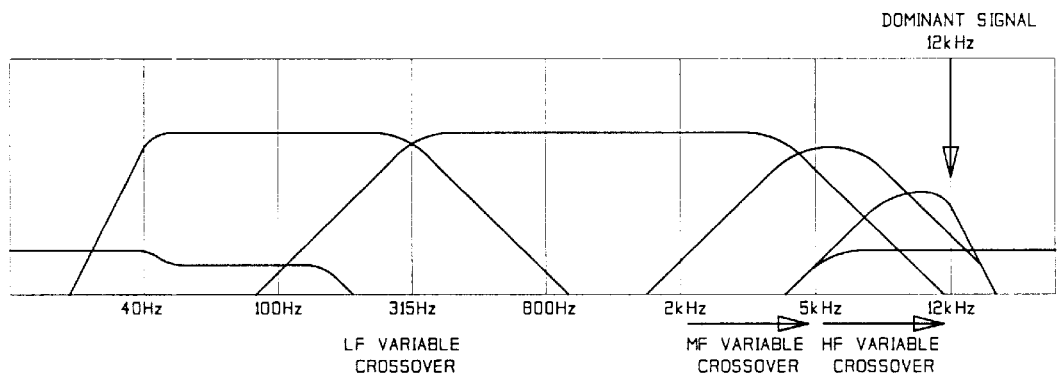

A dominant signal with a frequency below about 10 kHz will cause the mid-high variable crossover 212 to move only to the degree necessary to prevent significant compression of the upper MHF band 132d. Compressor circuit 174a receives the same control voltage from the high frequency weighting circuit 230a as the second single pole variable frequency crossover 128b. Because the same control voltage is applied to the compressor circuit 174a, the upper MHF band 132 is rendered less sensitive to frequencies below about 10 kHz. A dominant signal in the frequency range of about 3 kHz to 10 kHz will also cause the mid variable crossover 210 to shift upwards so that the maximum bandwidth that is compressed will not exceed about 3.2 kHz. Thus, the maximum noise reduction effect will be maintained over as wide a frequency range as possible. A dominant signal with a frequency above about 10 kHz will cause compression of upper MHF band 132d but will have increasingly less affect on the lower MHF band 132e as the frequency rises further above about 10 kHz. FIG. 5E shows a dominant frequency at about 8 kHz which will cause compression in both the lower and upper MHF bands 132e and 132d, however the mid-frequency variable crossover 210 will have shifted to about 4.5 kHz and hence the loss of noise reduction effect in the mid-frequency area will be minimized. At frequencies beyond about 10 kHz, high frequency weighting circuit 230b of crossover control path 180b limits the compression of lower MHF band 132e. Referring to FIG. 5F, a dominant frequency of about 12 kHz is applied which will cause the compression of upper MHF band 132d while lower MHF band 132e is not compressed.

Figure 6A:
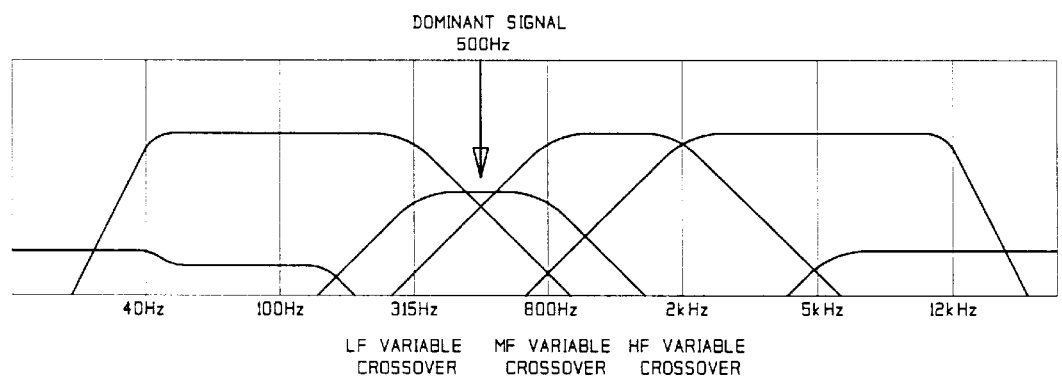
FIGS. 6A–E show a logarithmic graphical representation of six frequency bands of an audio information signal with a dominant signal at various points along the lower audio frequency spectrum as divided by the invention.
Figure 6B:
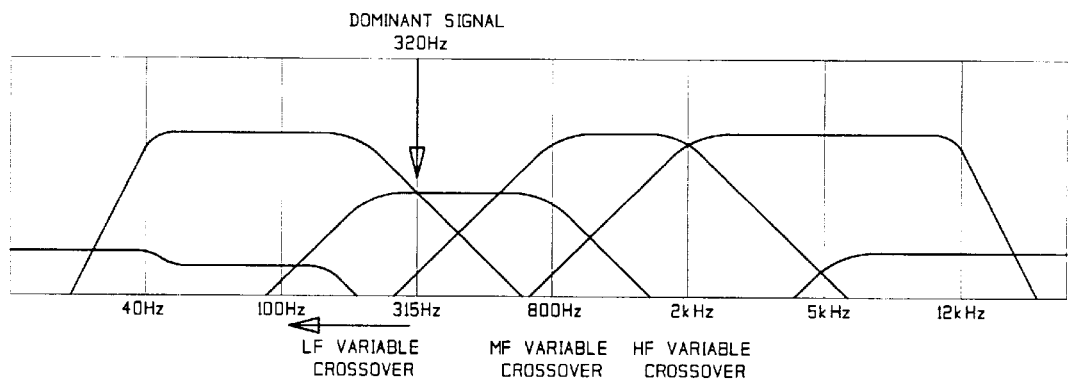
Figure 6C:
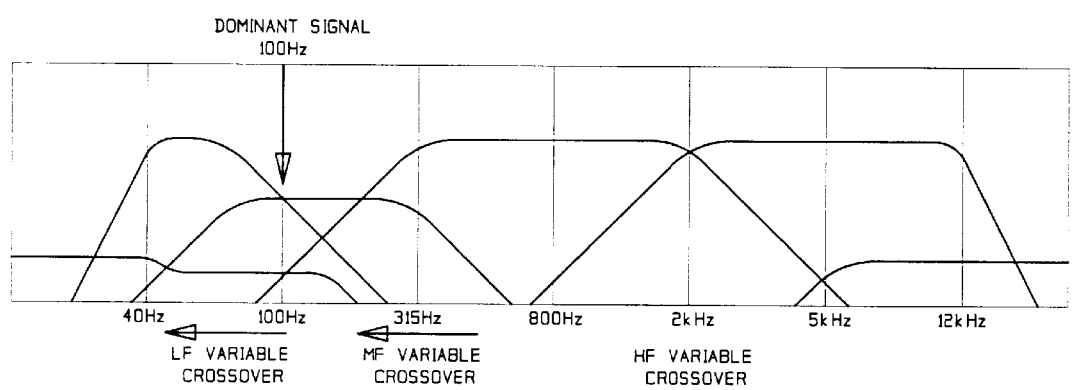
Figure 6D:
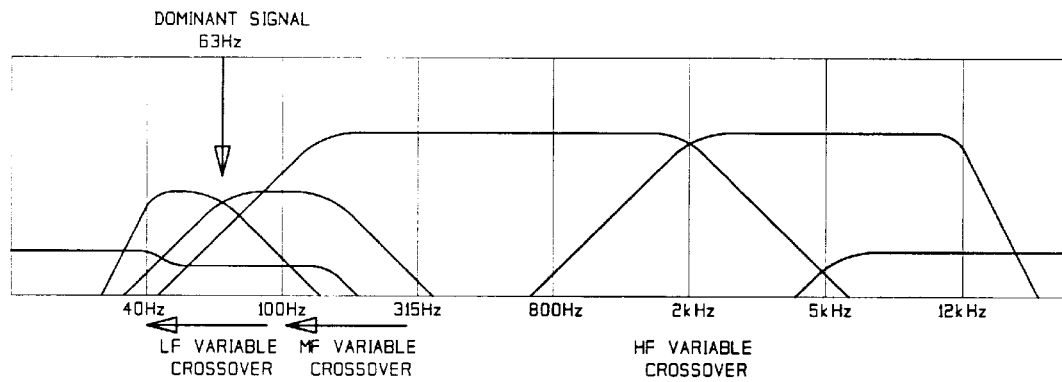
Figure 6E:
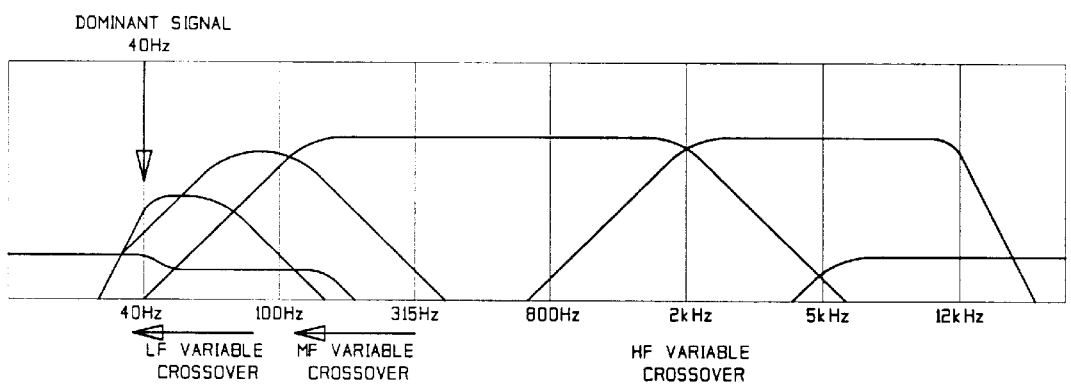

The invention provides similar effects of crossover frequency shifting and compression limiting for the low frequency bands. FIGS. 6A–E show the effects of the compression of upper MLF band 134e along with the shift of the mid-low variable frequency crossover 220 and the mid variable crossover 210. FIG. 6E shows the effects of a dominant signal at a frequency of about 40 Hz which causes compression of the lower MLF band 134d while the upper MLF band 134e is not compressed, similar to the effects shown in FIG. 5F for the high frequency effects.

Figure 7:
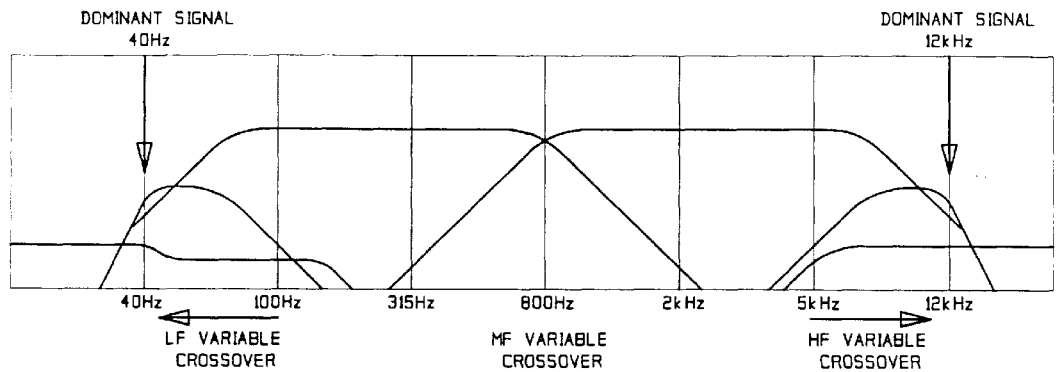
FIG. 7 shows a logarithmic graphical representation of six frequency bands of an audio information signal with a first dominant signal at the lower end of the audio frequency spectrum and a second dominant signal at the upper end of the audio frequency spectrum as divided by the invention.

FIG. 7 shows the effects of two dominant signals at opposite ends of the audio frequency spectrum, 40 Hz and 12 kHz, and the effects on the frequency bands. Both the lower MLF band 134d and the upper MHF band 132d are both compressed. The MHF crossover 212 is shifted up the frequency spectrum while the MLF crossover 220 is shifted down the frequency spectrum. The mid variable crossover 210 remains at the initial 800 Hz value because both the high pass bands and low pass bands pull with substantially equal weight, thus no shift of the mid variable crossover 210 occurs. Both upper MLF band 134e and the lower MHF band 132e are not compressed and are spread to cover the spectrum. Thus avoiding excessive compression of the information signal.

Upper most high frequency band 132b and lower most frequency band 134b are intended to create a reduction of signal strength in the 5 kHz to 20 kHz region in the presence of high level high frequency signals and below about 200 Hz in the presence of low frequency signals to prevent high and low frequency clipping in a recording or transmission medium which may have less headroom at high and low frequencies. As the level of high and low frequency signals increase, the relative contribution of upper most high frequency band 132b signals and lower most frequency band 134b signals in the output 192 also increase. As the upper most and lower most band 132b and 134b outputs are phase reversed relative to the mid frequency band 132d–e and 134d–e outputs (caused by the first and second summing circuits 146 and 164 to allow for subtraction) this results in a reduction of 5 kHz to 20 kHz information and a reduction in information below 200 Hz when sidechain signals are added to the main path 122 signal during encoding, and a complimentary increase in these frequencies when the sidechain signal is subtracted (again through phase reversal in the fifth summing circuit 196) from the main path 122 signal during decoding.

Figure 8A:
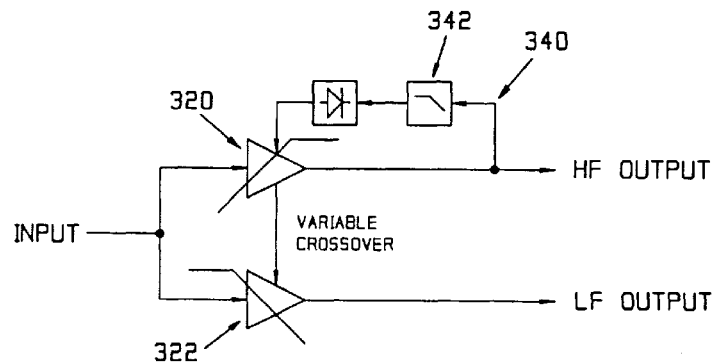
FIG. 8A shows a schematic diagram of one embodiment of a single pole variable frequency crossover circuit.
Figure 8B:
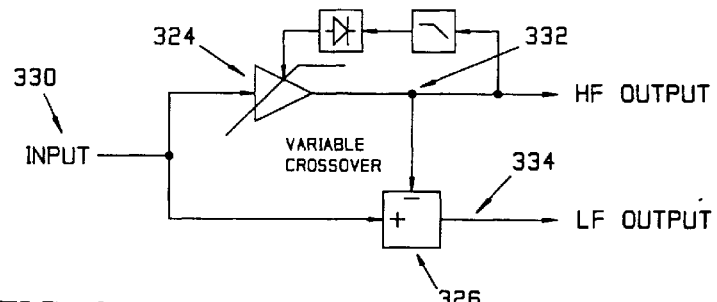
FIG. 8B shows a schematic diagram of an alternate embodiment of a single pole variable frequency crossover circuit.

FIGS. 8A and 8B depict two separate embodiments for the implementation of the variable frequency crossover circuits 128a–c. The embodiment shown in FIG. 8A includes a VHPF 320 and a VLPF 322 interconnected to allow the cutoff frequency's of each filter to track each other. Thus, VHPF 320 and VLPF 322 have substantially the same cutoff frequency. In this embodiment, precise design characteristics need to be met and the degree of accuracy achieved and correlation between cutoff frequencies is dependent on the precision achieved. FIG. 8B provides an alternate embodiment for achieving an upper frequency band and a lower frequency band each having substantially equal cutoff frequencies. In the embodiment shown in FIG. 8B, a single VHPF 324 is implemented to achieve the upper frequency band 332. The VHPF 324 receives input 330 while a summing circuit 326 is used to sum the inverse upper frequency band 332 with the input signal 330 to obtain the lower frequency band 334. A VLPF is utilized in an alternative embodiment (not shown) in place of the VHPF 324 to achieve substantially the same results. Both FIGS. 8A and 8B further include a control path 340 which includes frequency weighting circuit 342 which increases the sensitivity of the control path 340, as described above.

Figure 9:
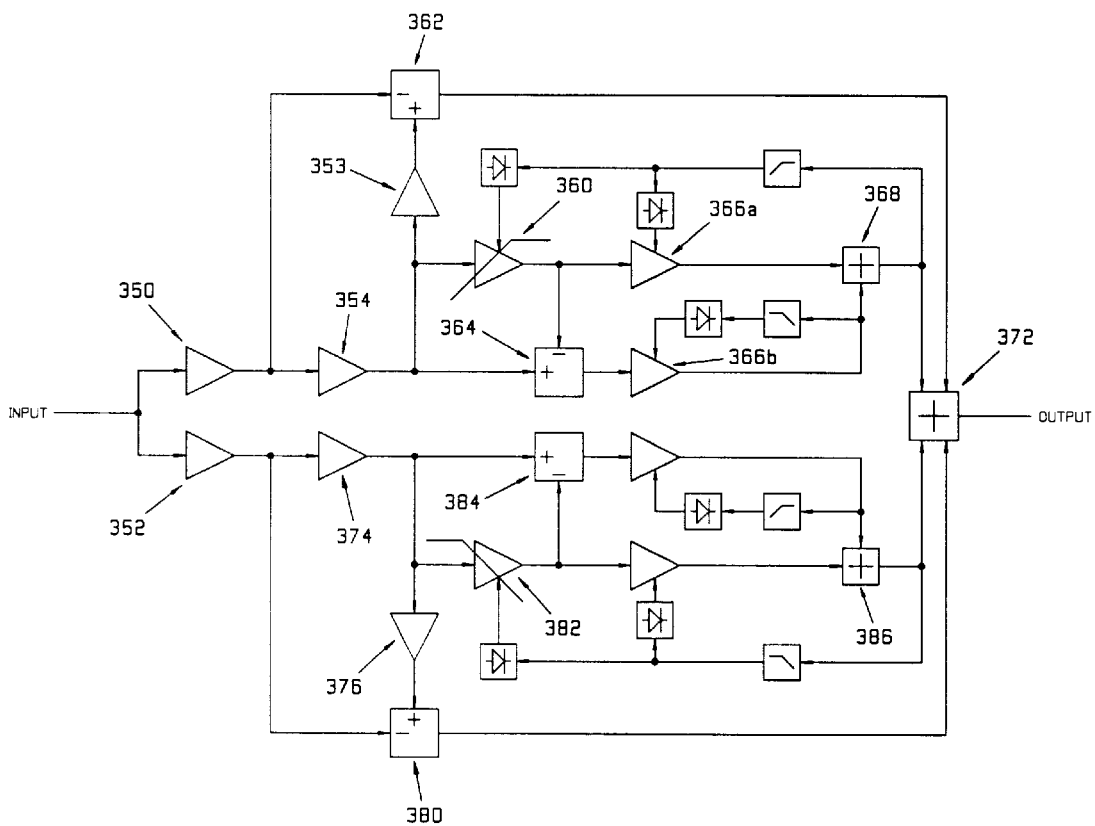
FIG. 9 depicts a schematic diagram of an alternate embodiment of the invention with two variable frequency crossover circuits.
Figure 10:
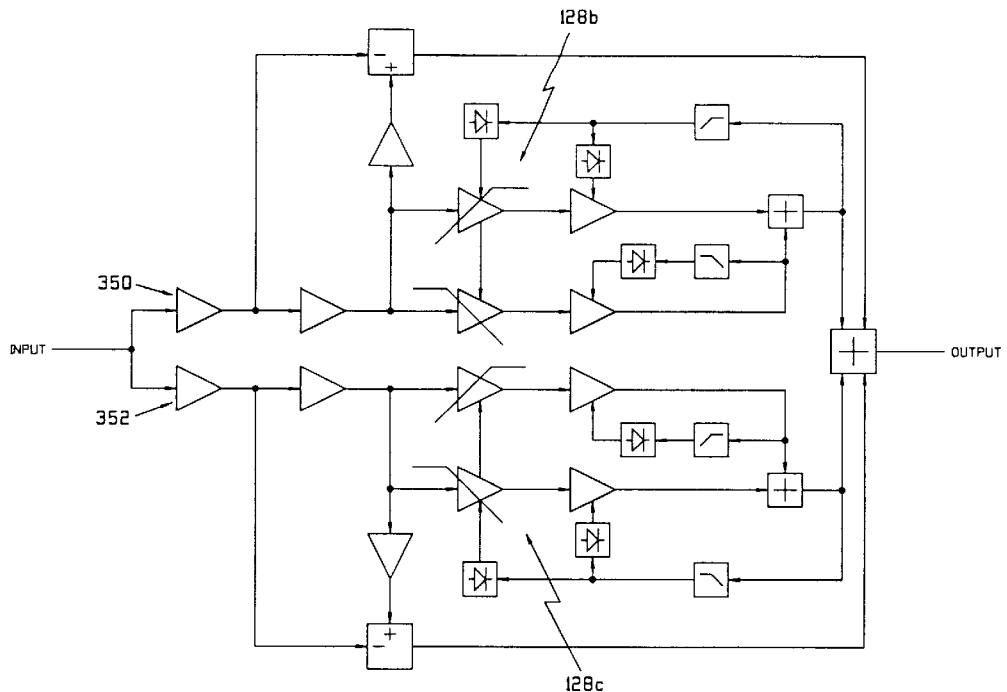
FIG. 10 depicts a schematic diagram of an alternate embodiment of the invention also with two variable frequency crossover circuits.

FIGS. 9 and 10 depict schematic diagrams of alternate embodiments of the present invention which employ single pole fixed frequency crossover circuit 128a, including FHPF 350 and FLPF 352, to pass the portion of the information signal within the mid frequency crossover 210. Single pole variable frequency crossover circuits 128b and 128c are further employed, as described above, to produce the MHF and MLF frequency crossovers 212 and 220. In the embodiment depicted in FIG. 9, the single pole variable frequency crossover circuits 128b and 128c are configured utilizing the variable frequency crossover circuit described in reference to FIG. 8B such that the initial mid band (upper or lower) is formed through the variable filter while the other mid band (lower or upper, respectively) is formed by subtracting the mid band from the variable filter from the input to the variable filter. This embodiment results in a less steep slope rolloff for the second output frequency band, but has the advantage of superior re-combining of the paths during summing of the various compressor outputs.

In the embodiment depicted in FIG. 10, the single pole variable frequency crossover circuits 128b and 128c are configured utilizing the variable frequency crossover circuit described in reference to FIG. 8A and previously described in detail in relation to FIG. 1. As such, a VLPF and a VHPF are interconnected to provide accurate tracking of the crossover frequency.

Figure 11:
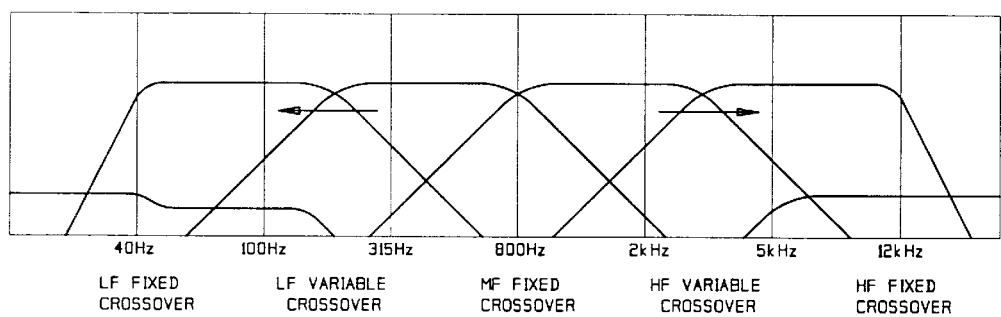
FIG. 11 shows a logarithmic graphical representation of six different frequency bands of an audio information signal as divided in the embodiments of the invention as shown in FIG. 9 and FIG. 10.

The embodiments shown in FIGS. 9 and 10 operates in a substantially similar manner as that described in relation to the embodiment depicted in FIG. 1. However, the mid crossover frequency 210 is fixed due to the information signal being initially divided by a fixed frequency crossover circuit including first FHPF 350 and first FLPF 352. Thus, only mid low frequency crossover 220 and mid high frequency crossover 212 are variable crossovers with the ability to adjust to high frequency or low frequency dominant signals as shown in FIG. 11.

For both the embodiments shown in FIGS. 9 and 10, the two MHF bands 132d and 132e each have substantially the same quiescent gain of about 20–25 dB and the two MLF bands 134d and 134e each have substantially the same quiescent gain of about 15–20 dB. The quiescent frequency of the mid-high frequency variable crossover 212 is approximately 2 kHz and the quiescent frequency of the mid-low frequency variable crossover 220 is approximately 315 Hz. The mid-high frequency crossover control paths are frequency weighted to increase sensitivity to high frequencies considerably beyond that afforded by the initial 800 Hz crossover. As the level of high frequency signals increases, the mid-high frequency crossover 212 moves upwards to broaden the bandwidth of the lower MHF band 132e with a corresponding reduction in the bandwidth of the upper MHF band 132d. Mid-high frequency crossover 212 continues to move upwards until it reaches a predefined limit, for example about 10 kHz, beyond which no further movement is permitted.

The low frequency crossover control paths are also frequency weighted to increase sensitivity to low frequencies considerably beyond that afforded by the initial 800 Hz crossover. As the level of low frequency signals increases, the mid-low frequency crossover 220 moves downwards to broaden the bandwidth of the upper MLF band 132e with a corresponding reduction in the bandwidth of the lower MLF band 134d. Mid-low frequency crossover 220 continues to move downwards until it reaches a predefined limit, for example about 80 Hz, beyond which no further movement is permitted.

A dominant signal with a frequency below about 10 kHz will cause the mid-high variable frequency crossover 212 to move only to the degree necessary to prevent compression of the upper MHF band 132d. Thus the maximum noise reduction effect will be maintained over as wide a frequency range as possible. A dominant signal with a frequency above about 10 kHz will cause compression of the upper MHF band 132d but will have increasingly less affect on the lower MHF band 132e as the frequency rises further above 10 kHz.

The description provided above include summing circuits which sum at least two signals. The term sum includes the addition of two signals having the same phase, and the addition of two signals having opposite phases, thus, in effect subtracting the two signals. The use of the terms sum, summing and summation are to be understood to include the addition and the subtraction of a plurality of signals.

The present invention provides a plurality of frequency bands with a plurality of variable crossovers and significant overlap between adjacent bands providing greater frequency spectrum coverage. The present invention limits the size of the bandwidth that is compressed. The variable frequency crossovers further allow a plurality of crossover to shift thus while one band is compressed the compression of other bands are limited. Because of the unique limiting features, the invention prevents a dominant high frequency signal component from causing the sliding filter from sliding above the frequency of the dominate signal. The present invention further achieves this efficient and effective compression and expansion of an information signal through the implementation of a simple circuit design.

While the present invention has been described with reference to a few specific embodiments, the description is illustrative of the invention and is not to be construed as limiting the invention. Various modifications may occur which are obvious to those skilled in the art while remaining within the true spirit and scope of the invention as defined by the appended claims.

What is claimed is:

1. A compressor or expander for use in noise reduction of an information signal, comprising:

an input terminal to receive the information signal;

a first frequency crossover circuit coupled to the input terminal and configured to divide a frequency spectrum of the information signal into a first and second frequency band;

a second frequency crossover circuit coupled with the first crossover circuit configured to receive at least a portion of the information signal within the first frequency band and to further divide the information signal into a third and fourth frequency band; and a third frequency crossover circuit coupled with the first crossover circuit configured to receive at least a portion of the information signal within the second frequency band and to divide the information signal into a fifth and sixth frequency band.

2. The compressor or expander as claimed in claim 1, the second frequency crossover circuit being configured as a variable frequency crossover circuit such that the third and fourth frequency bands are separated by a first variable crossover frequency.

3. The compressor or expander as claimed in claim 2, the third frequency crossover circuit being configured as a variable frequency crossover circuit such that the fifth and sixth frequency bands are separated by a second variable crossover frequency; and the first frequency crossover circuit being configured as a variable frequency crossover circuit such that the first and second frequency bands are separated by a third variable crossover frequency.

4. The compressor or expander as claimed in claim 3, further comprising:

a final summing circuit coupled with the first, second and third frequency crossover circuits and configured to sum at least a portion of the information signal within each of the first, the second, the third, the fourth, the fifth and the sixth frequency bands to generate an output.

5. The compressor or expander as claimed in claim 4, further comprising:

a first filter coupled with the first frequency crossover circuit and configured to receive the information signal within the first band and to pass at least a portion thereof; and a first summing circuit coupled with the first frequency crossover circuit and coupled with the first filter and configured to sum the portion of the information signal within the first band as divided by the first frequency crossover circuit and the portion of the information signal as passed by the first filter such that at least a portion of the information signal within the first band is passed by the first summing circuit.

6. The compressor or expander as claimed in claim 5, further comprising:

a second filter coupled with the first filter and the first summing circuit such that the second filter is configured to receive the portion of the information signal within the first band as passed by the first filter and to pass at least a portion of the information signal passed by the first filter to the first summing circuit to be summed with the information signal within the first band as divided by the first frequency crossover circuit.

7. The compressor or expander as claimed in claim 1, further comprising:

a first frequency control path coupled with the first frequency crossover circuit and configured to provide feedback control to the first frequency crossover circuit; and the first frequency control path includes at least one threshold circuit configured to provide feedback control when a frequency crossover defined between the third and fourth frequency bands shifts beyond a predefined threshold.

8. The compressor or expander as claimed in claim 7, the first frequency control path being coupled with at least the second frequency crossover circuit such that the feedback control is dependent on at least a portion of the third and fourth frequency bands; and the first frequency control path further being coupled to the third frequency crossover circuit and configured to provide differential feedback control to the first frequency crossover circuit.

9. The compressor or expander as claimed in claim 1, wherein:

a second frequency control path coupled with the second frequency crossover circuit and configured to provide feedback control to the second frequency crossover circuit; and the second frequency crossover circuit including at least one compressor circuit to receive at least a portion of the information signal within the third frequency band and to compress the amplitude of the portion of the information signal within the third frequency band received form the second frequency crossover circuit if a dominant signal exists within a predefined frequency range.

10. The compressor or expander as claimed in claim 9, wherein:

the second frequency control path further provides feedback control back to the compressor circuit; and the second frequency crossover control path includes at least one weighting circuit to provide greater frequency sensitivity to the second frequency crossover circuit.

11. The compressor or expander as claimed in claim 1, the first frequency crossover circuit including:

a first variable filter configured to receive the information signal and to pass the portion of the information signal within the first frequency band; and a first summing circuit coupled to the first variable filter and configured to sum the information signal and the portion of the information signal within first frequency band such that the first summing circuit passes the information signal within the second frequency band.

12. The compressor or expander as claimed in claim 11, the second frequency crossover circuit including:

a second variable filter configured to receive the portion of the information signal within the first frequency band and to pass the information signal within the third frequency band; and a second summing circuit coupled to the second variable filter and configured to sum the portion of the information signal within the first frequency band and the information signal within the third frequency band to pass the portion of the information signal within the fourth frequency band.

13. A compressor or expander configured to process an information signal, comprising:

(a) a high frequency subcircuit configured to receive the information signal and to divide the information signal into an initial high frequency band, including:

(i) an upper mid-high frequency (MHF) subcircuit coupled with the high frequency subcircuit and configured to receive at least a portion of the information signal within the initial high frequency band and to divide the portion of the information signal within the initial high frequency band into an upper MHF band; and (ii) a lower MHF subcircuit coupled with the high frequency subcircuit and configured to receive at least a portion of the information signal within the initial high frequency band and to divide the portion of the information signal within the initial high frequency band into a lower MHF band;

(b) a low frequency subcircuit configured to receive the information signal and to divide the information signal into an initial low frequency band, including:

(i) an upper mid-low frequency (MLF) subcircuit coupled with the low frequency subcircuit and configured to receive at least a portion of the information signal within the initial low frequency band and to divide the portion of the information signal within the initial high frequency band into an upper MLF band; and (ii) a lower MLF subcircuit coupled with the low frequency subcircuit and configured to receive at least a portion of the information signal within the initial low frequency band and to divide the portion of the information signal within the initial low frequency band into a lower MLF band; and (c) a final summing circuit coupled to the high frequency subcircuit, the low frequency subcircuit, the upper and lower MHF subcircuits, and the upper and lower MLF subcircuits and configured to sum at least a portion of the information signal within each of the initial high frequency band, the initial low frequency band, the upper and lower MHF bands, and the upper and lower MLF bands to generate an output.

14. The compressor or expander as claimed in claim 13, wherein:

the lower cutoff frequency of the upper high frequency subcircuit and the upper cutoff frequency of the lower high frequency subcircuit are substantially equal; and the lower cutoff frequency of the high frequency subcircuit and the upper cutoff frequency of the low frequency subcircuit are variable such that they shift up and down the frequency spectrum at approximately the same rate and same direction when a portion of the information signal includes a dominant signal having a frequency within a first predefined frequency range which is applied to the high and low frequency subcircuits.

15. The compressor or expander as claimed in claim 14, wherein:

the lower cutoff frequency of the upper MHF subcircuit and the upper cutoff frequency of the lower MHF subcircuit are substantially equal;

the lower cutoff frequency of the upper MLF subcircuit and the upper cutoff frequency of the lower MLF subcircuit are substantially equal;

the lower cutoff frequency of the upper MLF subcircuit and the upper cutoff frequency of the lower MLF subcircuit are variable such that they shift up and down the frequency spectrum at approximately the same rate and same direction when a portion of the information signal includes a dominant signal having a frequency within a second predefined frequency range which is applied to the high and low frequency subcircuits; and the lower cutoff frequency of the upper MHF subcircuit and the upper cutoff frequency of the lower MHF subcircuit are variable such that they shift up and down the frequency spectrum at approximately the same rate and same direction when a portion of the information signal includes a dominant signal having a frequency within a second predefined frequency range which is applied to the high and low frequency subcircuits.

16. The compressor or expander as claimed in claim 13, wherein:
   the high frequency subcircuit includes a first filter;
   the low frequency subcircuit includes a second filter;
   the first and second filters are interconnected such that a cutoff frequency of the first filter is approximately equal to a cutoff frequency of the second filter; and
   the first and second filters form a first frequency crossover circuit.

17. The compressor or expander as claimed in claim 16, wherein:
   the first and second filters are variable filters such that the cutoff frequency for both the first and second filters shift up and down the frequency spectrum when a portion of the information signal includes a dominant signal which has a frequency within a predefined range.

18. The compressor expander as claimed in claim 13, wherein:
   a frequency crossover circuit of the high frequency subcircuit includes at least two variable filters interconnected; and
   a frequency crossover circuit of the low frequency subcircuit includes at least two variable filters interconnected.

19. A compressor or expander for use in noise reduction of an information signal, comprising:
   an input terminal to receive the information signal;
   a first means for dividing a frequency spectrum of the information signal into first and second frequency bands, the first means for dividing coupled to the input terminal;
   a second means for dividing the portion of the information signal within the first frequency band into third and fourth frequency bands, the second means for dividing coupled to the first means for dividing; and
   a third means for dividing at least a portion of the information signal within the second frequency band into fifth and sixth frequency bands, the third means for dividing coupled to the first means for dividing.

20. The compressor or expander as claimed in claim 19 further comprising:
   the first means for dividing including a first means for variable dividing the information signal such that the first and second frequency bands are separated by a first variable crossover frequency;
   the second means for dividing including a second means for variably dividing the portion of the information signal within the first frequency band such that the third and fourth frequency bands are separated by a second variable crossover frequency;
   the third means for dividing including a third means for variably dividing the portion of the information signal within the second frequency band such that the fifth and sixth frequency bands are separated by a third variable crossover frequency; and
   a final means for summing at least a portion of the information signal within each of the first, second, third, fourth, fifth and sixth frequency bands to generate an output, the final means for summing coupled with the first, second and third means for dividing.

21. The compressor or expander as claimed in claim 20, further comprising:
   a first means for filtering the portion of the information signal within the first band and to pass at least a portion thereof, the first means for filtering coupled with the first means for dividing;
   a first means for summing the portion of the information signal within the first band as divided by the first means for dividing and the portion of the information signal as passed by the first means for filtering such that at least a portion of the information signal within the first band is passed by the first means for summing, the first means for summing coupled with the first means for dividing and coupled with the first means for filtering;
   a second means for filtering the portion of the information signal within the first band as passed by the first means for filtering and to pass at least a portion of the information signal to the first means for summing to be summed with the information signal within the first band as divided by the first means for dividing, the second means for filtering coupled with the first means for filtering and the first means for summing;
   a first means for provide feedback control to the first means for dividing, the first means for providing feedback control coupled with the first means for dividing;
   the first means for providing feedback control further coupling with the second means for dividing such that the feedback control is dependent on at least a portion of the third and fourth frequency bands;
   the first means for providing feedback control including at least one means for determining a threshold to provide feedback control when a frequency crossover defined between the third and fourth frequency bands shifts beyond a predefined threshold;
   the first means for providing feedback control further coupling to the third means for dividing and configured to provide differential feedback control to the first means for dividing;
   a second means for providing feedback control to provide feedback control to the second means for dividing; and
   the second means for dividing including at least one means for compressing an amplitude of at least a portion of the information signal within the third frequency band received from the second means for dividing if a dominate signal exists within a predefined frequency range.

22. The compressor or expander as claimed in claim 19 further comprising:
   the first means for dividing including:
      a first means for variable filtering the information signal and to pass the portion of the information signal within the first frequency band;
      a first means for summing coupled to the first means for variable filtering and configured to sum the information signal and the portion of the information signal within the first frequency band to pass the portion of the information signal within the second frequency band;
   the second means for dividing including:
      a second means for variable filtering the portion of the information signal within the first frequency band and to pass the portion of the information signal within the third frequency band; and a second means for summing coupled to the second means for variable filtering and configured to sum the portion of the information signal within the first frequency band and the portion of the information signal within the fourth frequency band to pass the portion of the information signal within the fourth frequency band.

23. A method for compressing or expanding an information signal, comprising the steps of:

receiving the information signal;

dividing the information signal into a plurality of frequency bands;

creating at least two variable crossover frequencies such that each variable crossover frequency defines a boundary between at least two frequency bands; and shifting at least one of the variable crossover frequencies along the frequency spectrum when the information signal includes a dominant signal at a frequency within a predefined frequency range.

24. The method as claimed in claim 23, wherein:

the dividing step includes dividing the information signal into at least three variable crossover frequencies.

25. The method as claimed in claim 23, wherein:

the dividing step includes:

initially dividing the information signal into at least a first and a second frequency band;

further dividing the first frequency band into at least a third and fourth frequency band; and further dividing the second frequency band into at least a fifth and sixth frequency band.

26. The method as claimed in claim 23 further comprising:

controlling at least one of the crossover frequencies according to spectral and level contents of the information signal.

27. The method as claimed in claim 23, wherein:

the shifting step includes maintaining the relationship of an upper cutoff frequency for a lower band and a lower cutoff frequency for an upper band of two adjacent frequency bands defining one of the variable crossover frequency as the variable crossover frequency shifts up or down the frequency spectrum.

28. The method as claimed in claim 27 further comprising:

the maintaining step including controlling the cutoff frequencies through at least one control feedback;

the step of controlling including controlling the crossover frequency through a difference between two control feedbacks for two adjacent cutoff frequencies of two adjacent frequency bands; and frequency weighting at least one of the control feedbacks.

29. A variable frequency crossover circuit configured to receive a complex information signal having a spectral and level content and to divide the information signal into two frequency bands, the variable frequency crossover circuit comprising:

an input terminal configured to receive the information signal;

a variable frequency filter coupled to the input terminal and configured to pass at least a portion of the input signal within a first frequency band;

a summing circuit coupled to the input terminal and the variable frequency filter, and configured to invert the at least a portion of the input signal within the first frequency band and sum the information signal and the inverted signal to pass a remaining portion of the information signal within a second frequency band; and a first output terminal coupled to the variable frequency filter and configured to output the information signal within the first frequency band, and a second output terminal coupled to the summing circuit and configured to output the information signal within the second frequency band.

30. A variable frequency crossover circuit configured to receive a complex information signal having a spectral and level content, and to divide the information signal into at least two frequency bands, the variable frequency crossover circuit comprising:

an input terminal configured to receive the information signal;

a first variable frequency filter coupled to the input terminal to receive the information signal, and configured to pass a portion of the information signal within a first frequency band;

a second variable frequency filter coupled to the input terminal to receive the information signal, and configured to pass a remainder of the information signal within a second frequency band; and a first output terminal coupled to the first variable frequency filter to receive the portion of the information signal within the first band and a second output terminal coupled to the second variable frequency filter to receive the remainder of the information signal within the second band.

31. A circuit according to claim 30, the first and second variable frequency filters being controlled by a common control signal such that cut-off frequencies of the filters track in tandem.

* * * * *